United States Patent
Cheng et al.

(10) Patent No.: US 9,564,326 B2
(45) Date of Patent: Feb. 7, 2017

(54) LITHOGRAPHY USING INTERFACE REACTION

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/333,544

(22) Filed: Jul. 17, 2014

(65) Prior Publication Data
US 2016/0020098 A1    Jan. 21, 2016

(51) Int. Cl.
| | |
|---|---|
| H01L 21/033 | (2006.01) |
| H01L 21/268 | (2006.01) |
| H01L 21/308 | (2006.01) |
| H01L 21/311 | (2006.01) |
| H01L 29/78 | (2006.01) |
| H01L 21/027 | (2006.01) |
| H01L 21/3105 | (2006.01) |
| H01L 21/324 | (2006.01) |

(52) U.S. Cl.
CPC ....... *H01L 21/0337* (2013.01); *H01L 21/0274* (2013.01); *H01L 21/0332* (2013.01); *H01L 21/31055* (2013.01); *H01L 21/324* (2013.01)

(58) Field of Classification Search
CPC ................ H01L 21/3086; H01L 21/311; H01L 29/66795; H01L 21/845

USPC ....... 430/285.1; 438/696, 232; 264/220, 225
See application file for complete search history.

(56) References Cited

U.S. PATENT DOCUMENTS

| | | | |
|---|---|---|---|
| 6,306,707 B1 | 10/2001 | Foster et al. | |
| 7,351,648 B2 | 4/2008 | Furukawa et al. | |
| 7,587,810 B2 | 9/2009 | Le | |
| 8,163,658 B2 | 4/2012 | Lin | |
| 8,492,278 B2 | 7/2013 | Good et al. | |
| 2002/0072195 A1* | 6/2002 | Anma ............... | H01L 21/76224 438/401 |
| 2004/0029047 A1* | 2/2004 | Ishibashi .......... | G03F 7/40 430/296 |
| 2006/0099728 A1* | 5/2006 | Wang et al. ........ | 438/26 |
| 2007/0161183 A1 | 7/2007 | Hwang | |
| 2009/0179002 A1* | 7/2009 | Cheng et al. ...... | 216/41 |

(Continued)

FOREIGN PATENT DOCUMENTS

| | | |
|---|---|---|
| CN | 101673701 A | 3/2010 |
| CN | 102437104 A | 5/2012 |

(Continued)

*Primary Examiner* — Kimberly Rizkallah
*Assistant Examiner* — Brian Turner
(74) *Attorney, Agent, or Firm* — Andrew G. Wakim

(57) ABSTRACT

A method of forming a semiconductor structure by; forming a first mask trench in a first mask, where the first mask is on a substrate; forming a second mask in the first mask trench; and forming a third mask between the first mask and the second mask by reacting the first mask with the second mask, where the first mask, the second mask, and the third mask all have different etching properties and the third mask is a combination of the first mask and the second mask.

4 Claims, 6 Drawing Sheets

(56) References Cited

U.S. PATENT DOCUMENTS

| | | | |
|---|---|---|---|
| 2010/0112820 A1* | 5/2010 | Balut | H01L 21/308 438/712 |
| 2010/0255430 A1* | 10/2010 | Dammel | G03F 7/0757 430/325 |
| 2011/0147985 A1* | 6/2011 | Cheng et al. | 264/225 |
| 2011/0272381 A1* | 11/2011 | Millward et al. | 216/37 |
| 2014/0175543 A1* | 6/2014 | Glass | H01L 21/823431 257/337 |
| 2014/0291878 A1* | 10/2014 | Somervell | 264/40.1 |
| 2015/0123212 A1* | 5/2015 | Hu et al. | 257/401 |
| 2015/0194525 A1* | 7/2015 | Xu | H01L 29/66795 257/192 |

FOREIGN PATENT DOCUMENTS

| | | |
|---|---|---|
| CN | 102903628 A | 1/2013 |
| JP | 2009278142 A | 11/2009 |

* cited by examiner

LITHOGRAPHY USING INTERFACE REACTION

BACKGROUND

The present invention relates generally to semiconductor device manufacturing, and more particularly to forming a third mask between a first mask and a second mask by reacting the first mask with the second mask.

Lithography is employed in many applications to pattern layers in semiconductor processing. One process where lithography is useful includes the process for producing trench patterns. As dimensions shrink in semiconductor devices, forming trench patterns using lithography becomes increasingly difficult.

SUMMARY

According to one embodiment of the present invention, a method of forming a semiconductor structure is provided. The method may include forming a first mask trench in a first mask, wherein the first mask is on a substrate; forming a second mask in the first mask trench; and forming a third mask at a vertical interface between the first mask and the second mask using a diffusion process, wherein the third mask extends into a portion of the first mask and into a portion of the second mask, and wherein the third mask is a combination of the first mask and the second mask.

According to another embodiment of the present invention, a method of forming a semiconductor structure is provided. The method may include forming a first mask and a second mask having a vertical interface between the first mask and the second mask; forming a third mask at a vertical interface between the first mask and the second mask using a diffusion process, wherein the third mask extends into a portion of the first mask and into a portion of the second mask, and wherein the third mask is a combination of the first mask and the second mask; forming a transfer pattern in a post-reaction layer, the post-reaction layer comprising the first mask, the second mask, and the third mask, and forming the transfer pattern further comprising: forming a first pattern by removing a portion of the first mask selective to the second mask and the third mask; and forming a second pattern by removing a portion of the second mask selective to the first mask and the third mask.

According to another embodiment of the present invention, a method of forming a semiconductor structure is provided. The method may include forming a first material trench in a first material, wherein the first material is on a lower semiconductor material; forming a second material in the first material trench; and forming a third material at a vertical interface between the first material and the second material using a diffusion process, wherein the third material extends into a portion of the first material and into a portion of the second material, and wherein the third material is a combination of the first material and the second material.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
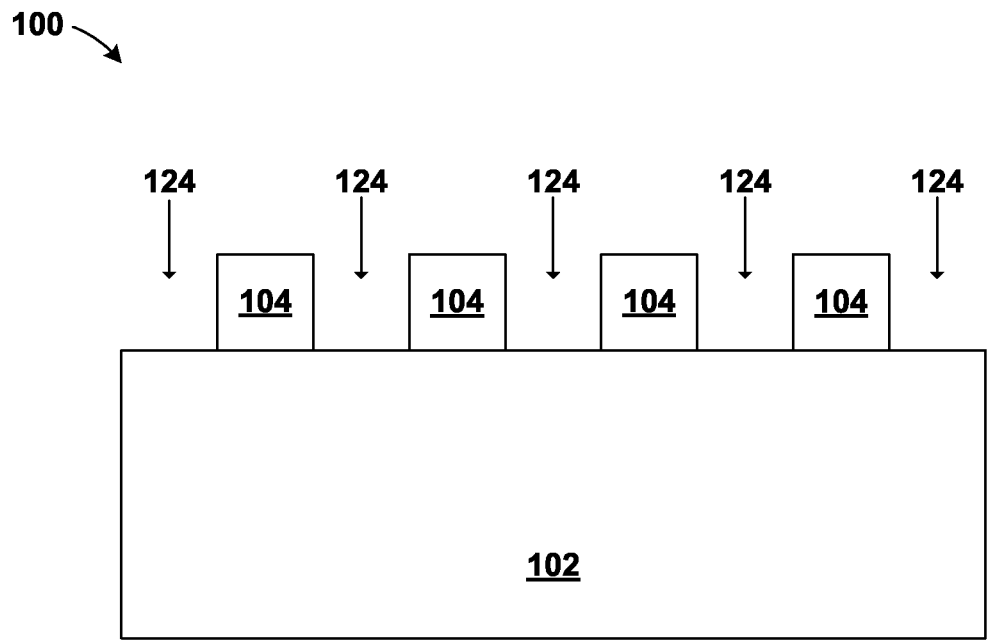
FIG. 1 is a cross section view of a semiconductor structure and illustrates the formation of a first mask trench in a first mask, according to an embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor device manufacturing, and more particularly to forming a third mask between a first mask and a second mask by reacting the first mask with the second mask. Ideally, it may be desirable to avoid or prevent lithographical errors by using a reaction between a first mask and a second mask to form a third mask rather than using traditional lithography techniques which may be restricted by pitch widths and tolerance limitations. One way to fabricate a third mask using a reaction is to form a first mask and a second mask having a vertical interface between the first mask and the second mask then use diffusion between the first mask and the second mask to form a third mask. One embodiment by which to form a third mask is described in detail below by referring to the accompanying drawings FIGS. 1-5.

In general, the proposed method includes deposition and patterning of a single material A using conventional deposition and lithography techniques; then deposition and polishing of a material B to fill the gap or openings in the material A; then using a process to cause a reaction, such as diffusion, to react material A with material B such that a material C forms at an interface, the material C having a different etch property or etch rate. Any of the materials A, B, C or depending on the application, any pair of them (for example, A and B, A and C, or B and C) can be selectively removed to create a desired pattern that is not possible to create by conventional lithography or sidewall-image-transfer process (STI).

FIG. 1 is a demonstrative illustration of a structure 100 during an intermediate step of a method of fabricating a post-reaction layer having three different materials on a same level. More specifically, the method can start with forming a first mask 104 on top of a substrate 102.

The substrate 102 can include; a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other II/VV or II/VI compound semiconductors. In an embodiment, the substrate 102 may be a bulk silicon substrate or a semiconductor-on-insulator substrate, as are well known in the art. Alternatively, the substrate 102 may also include any dielectric materials known in the art, such as, for example, oxides, nitrides and oxynitrides. In an exemplary embodiment, the substrate 102 may be one of multiple inter-level dielectric layers located in a back end of line of the structure 100. In such cases, the substrate 102 may be above a semiconductor substrate, a metal level, a via level, a middle-end-of-line, a back-end-of-line, or any other level of the structure 100.

The first mask 104 may be formed on the substrate 102 using any deposition technique known in the art, such as, for example, chemical vapor deposition, plasma enhanced chemical vapor deposition, atomic layer deposition, or physical vapor deposition. The first mask 104 may be any masking material known in the art which is capable of reacting with another masking material to form a third masking material with different etch properties, such as, poly-crystalline silicon and poly-crystalline germanium. In an embodiment, the first mask 104 may be poly-crystalline silicon.

Next, a first mask trench 124 may be formed in the first mask 104 using known trenching techniques, such as, for example, a lithography technique followed by an etching technique. The first mask trench 124 may remove portions of the first mask 104 and expose the substrate 102.

Figure 2:
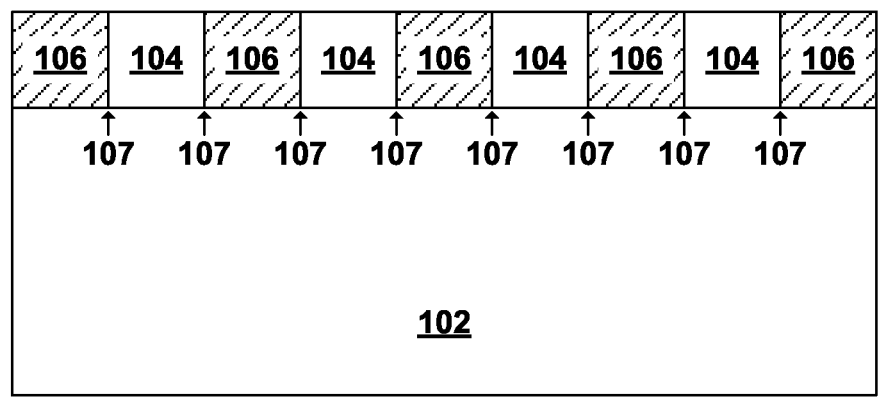
FIG. 2 is a cross section view of the semiconductor structure and illustrates the formation of a second mask in the first mask trench, according to an embodiment.

FIG. 2 is a demonstrative illustration of the structure 100 during an intermediate step of a method of fabricating the post-reaction layer having three different materials on the same level. More specifically, the method can include forming a second mask 106 in the first mask trench 124 and on top of the substrate 102.

More specifically, the second mask 106 may be deposited above the entire structure 100, including on top of the first mask 104 and within the first mask trench 124 and may be in direct contact with the substrate 102. The second mask 106 may be formed using any deposition technique known in the art, such as, for example, chemical vapor deposition, plasma enhanced chemical vapor deposition, atomic layer deposition, or physical vapor deposition. The second mask 106 may be any masking material known in the art which is capable of reacting with another masking material to form a third masking material with different etch properties, such as, poly-crystalline silicon and poly-crystalline germanium forming a silicon-germanium alloy. The second mask 106 may have different etch properties, and more specifically a different etch rate, than the first mask 104. In an embodiment, the second mask 106 may be poly-crystalline germanium and the first mask 104 may be poly-crystalline silicon.

Next, the second mask 106 may be planarized exposing the first mask 104. The second mask 106 may be planarized using any technique known in the art, such as, for example, chemical-mechanical polishing (CMP). It should be noted that the first mask 104 and the second mask 106 may be in direct contact along a vertical interface 107.

Figure 3:
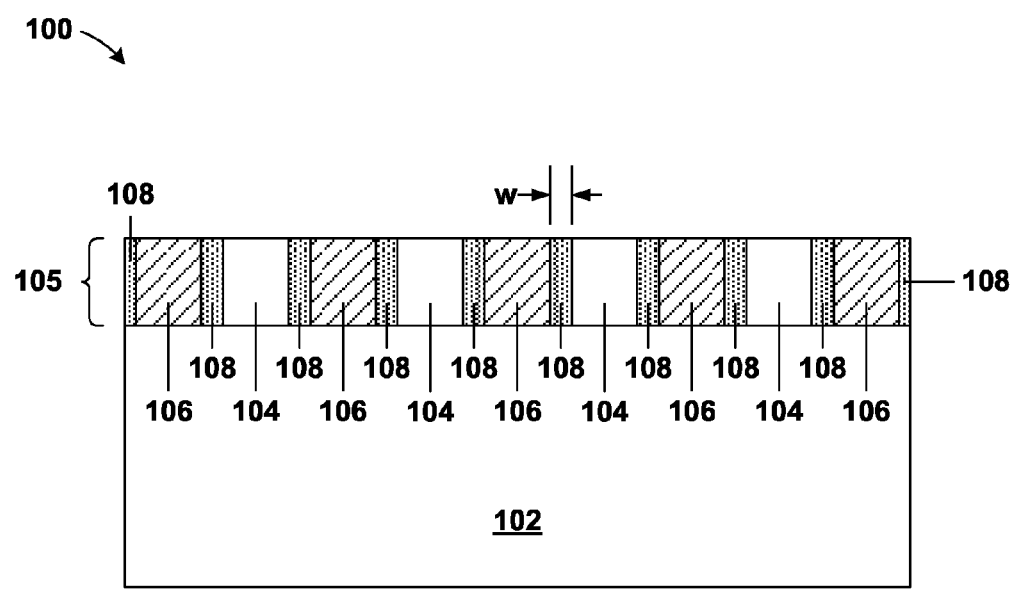
FIG. 3 is a cross section view of the semiconductor structure and illustrates the formation of a third mask between the first mask and the second mask by reacting the first mask with the second mask, according to an embodiment.

FIG. 3 is a demonstrative illustration of the structure 100 during an intermediate step of a method of fabricating the post-reaction layer 105 having three different materials on the same level. More specifically, the method can include forming a third mask 108 between the first mask 104 and the second mask 106.

The structure 100 may undergo a process or technique to induce some interaction or reaction between the first mask 104 and the second mask 106 at the vertical interface 107. The reaction between the first mask 104 and the second mask 106 may generate a third mask 108. In general, the third mask 108 may be some alloy that is a combination of the material from the first mask 104 and the second mask 106.

In an embodiment, elements of the first mask 104 and elements of the second mask 106 diffuse to form an alloy. In such cases, the alloy would be the third mask 108. For example, if the first mask 104 is poly-crystalline silicon and the second mask 106 is poly-crystalline germanium creating the third mask 108 being a silicon-germanium alloy.

The interaction or reaction between the first mask 104 and the second mask 106 may include but is not limited to, for example, and bonding interaction or a non-bonding interaction. The interaction or reaction between the first mask 104 and the second mask 106 may be induced by close proximity diffusion through heating, annealing, or a plasma reaction.

In general, the third mask 108 may form along the vertical interface 107. The third mask 108 may have a width (w) ranging from 2 nm to 500 nm. The width (w) may be dictated by the diffusion properties of the first mask 104 and the second mask 106, as well as the method of inducing the reaction, such as annealing.

Here, the width of the third mask 108 can be beneficial because the width (w) can be smaller than is currently possible by typical lithography used in the art. Some benefits over a typical lithography process such as sidewall image transfer (SIT) is that SIT may require a non-filling deposition of the spacer material which can be limited with tight trench pitches and high aspect ratios. Also, reactive ion etching may be required after sidewall spacer deposition which may not form a uniform structure, specifically at tight pitches.

A post-reaction layer 105 may include the first mask 104, the second mask 106, and the third mask 108. It should be noted that the first mask 104, the second mask 106, and the third mask 108 may together form a single layer in which (in the exemplary embodiment) each of the first mask 104, the second mask 106, and the third mask 108 may extend from an upper surface of the post reaction layer 105 to an upper surface of the substrate 102.

Figure 4:
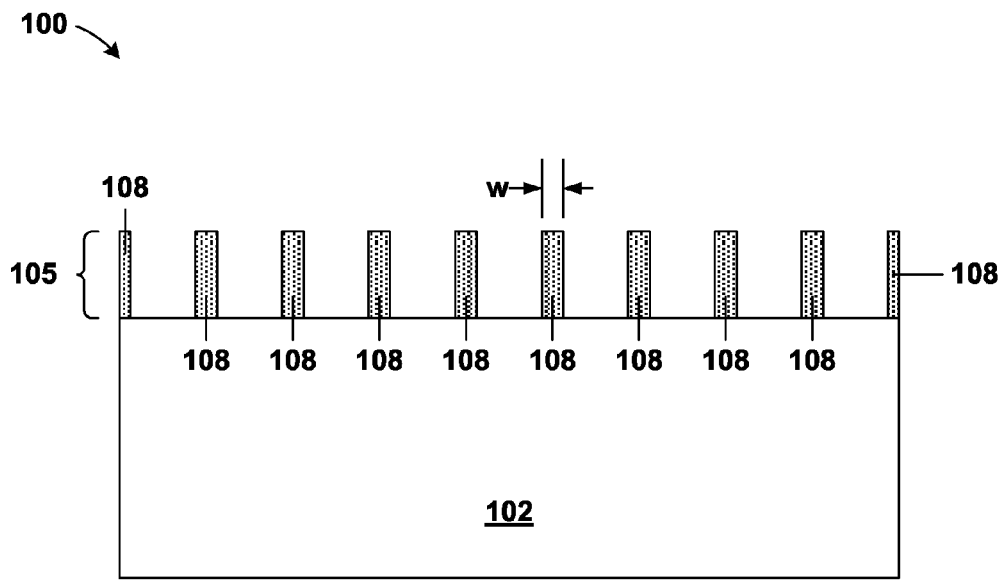
FIG. 4 is a cross section view of the semiconductor structure and illustrates the removal of the first mask and the second mask, according to an embodiment.
Figure 5:
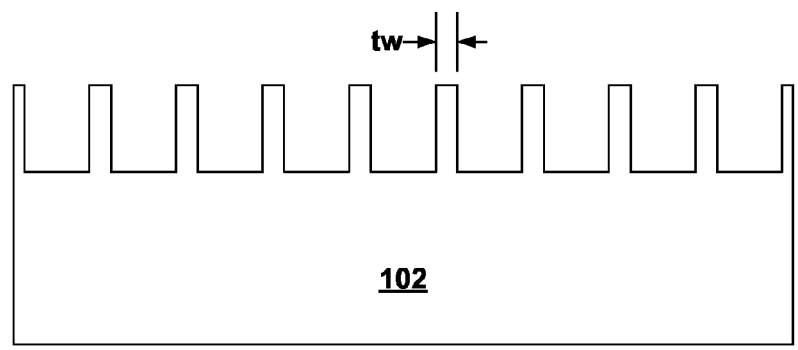
FIG. 5 is a cross section view of the semiconductor structure and illustrates a transfer of a third mask pattern into a substrate.

FIGS. 4 and 5 are demonstrative illustrations of the structure 100 during an intermediate step of a method of using the post-reaction layer 105 to form a final pattern in the substrate 102. More specifically, the method can include removing the first mask 104 and the second mask 106 from the post-reaction layer 105 and transferring a third mask pattern into the substrate 102.

Each of the first mask 104, the second mask 106 and the third mask 108 may have different etch properties. Different etch properties may include different etch rates. Different etching rates between the first mask 104, the second 106, and third mask 108 may allow for customization of the post-reaction layer 105. More specifically, each mask may be removed selective to the others to produce a desired pattern.

In an exemplary embodiment, the first mask 104 and the second mask 106 may be removed from the post-reaction layer 105 forming the third mask pattern, the transfer pattern is a pattern of the third mask 108 and voids where the first mask 104 and the second mask 106 were removed. The transfer pattern may be transferred into the substrate 102 to form a final pattern. The transfer pattern may have sidewalls with a transfer width (tw) that may result from the width (w) of the third mask 108. As stated above, the width (w) may be attainable through this process, but not through ordinary lithography, because of the limitations of lithography, therefore, the transfer pattern in the substrate 102 may have thinner sidewalls than would ordinarily be attainable.

An alternative embodiment may exist after forming the post-reaction layer 105. Since the first mask 104, the second mask 106, and the third mask 108 have different properties, the post-reaction layer 105 may be customizable to remove portions of each mask.

Figure 6:
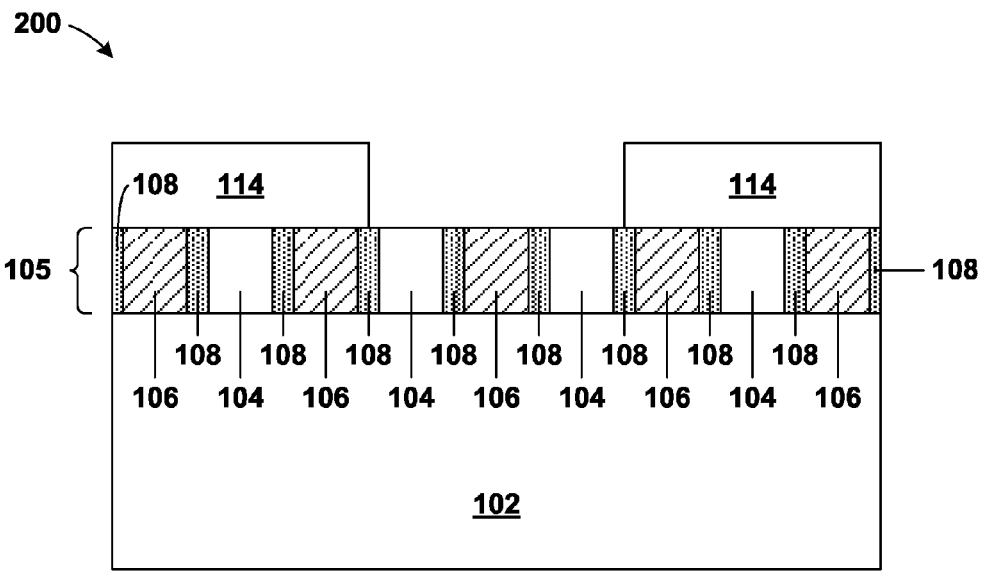
FIGS. 6 and 7 are cross section views of an alternative semiconductor structure and illustrate the formation of a first pattern in a post-reaction layer, where the post-reaction layer includes the first mask, the second mask, and the third mask, according to another embodiment.
Figure 7:
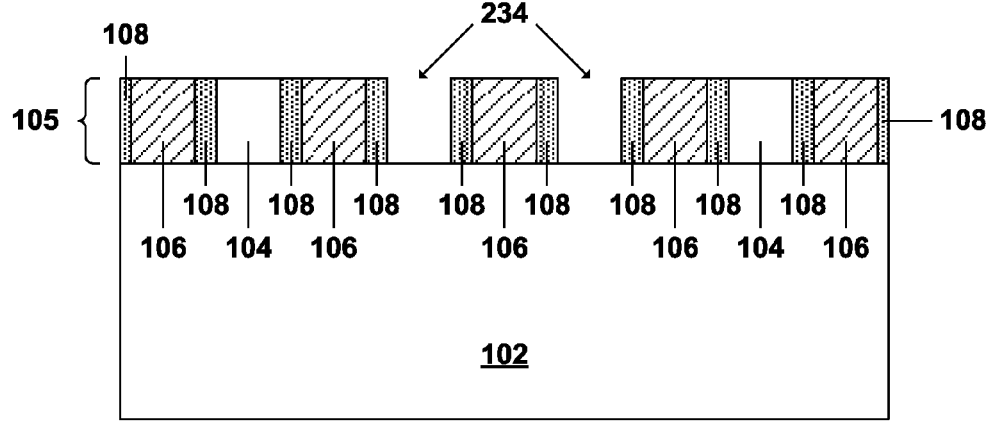

FIGS. 6 and 7 are demonstrative illustrations of an alternative structure 200 during an intermediate step of a method of using the post-reaction layer 105 to form the final pattern in the substrate 102. In this embodiment, the method can start with forming a first pattern 234 in the post-reaction layer 105.

A first mask removal layer 114 may be used to form the first pattern 234. The first pattern 234 may be the voids created where the first mask 104 was removed. The first mask removal layer 114 may be any masking material known in the art, such as, for example, oxide, nitride, or oxynitrides. The first mask removal layer 114 may have a thickness ranging from about 10 nm to 500 nm. The first pattern 234 may be formed using a first removal step, where the first removal step may be any etching technique known in the art, such as, for example, Tetramethylammonium Hydroxide (TMAH) or hydrogen peroxide, which removes portions of the first mask 104 from the post-reaction layer 105. In this embodiment, the portions of the first mask 104 removed will expose the substrate 102 underneath the portions of the first mask 104.

Figure 8:
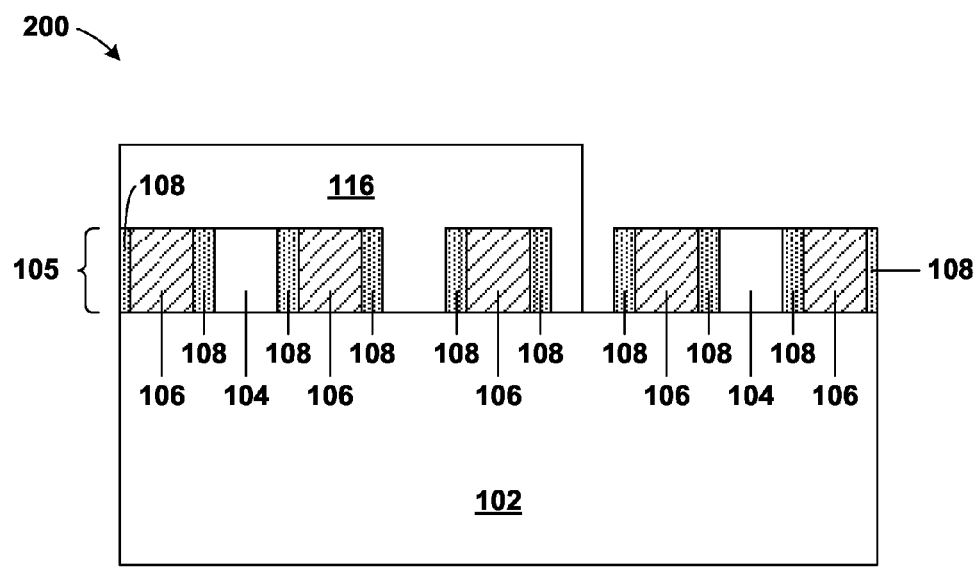
FIGS. 8 and 9 are cross section views of the alternative semiconductor structure and illustrate the formation of a second pattern in the post-reaction layer, according to another embodiment.
Figure 9:
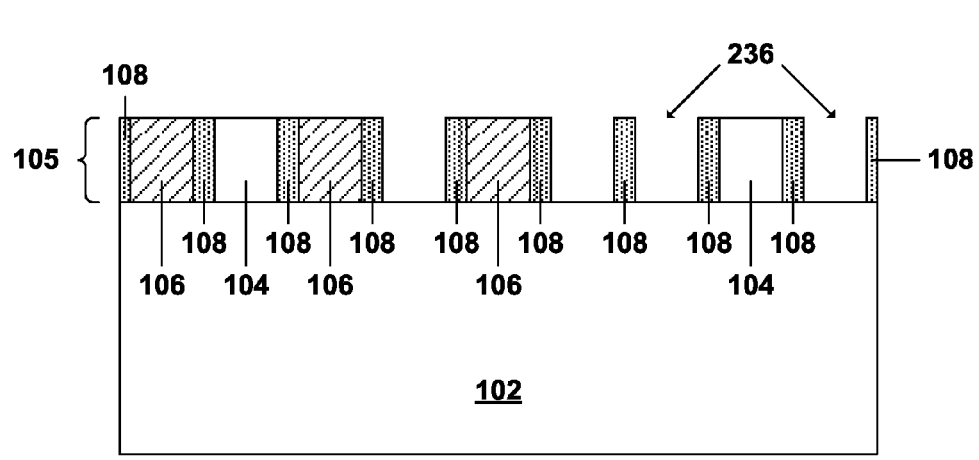

FIGS. 8 and 9 are demonstrative illustrations of the structure 200 during an intermediate step of a method of using the post-reaction layer 105 to form the final pattern in the substrate 102. More specifically, the method can include forming a second pattern 236 in the post-reaction layer 105.

A second mask removal layer 116 may be used to form a second pattern 236. The second pattern 236 may be the voids created where the second mask 106 was removed. The second mask removal layer 116 may be any masking material known in the art, such as, for example, oxide, nitride, or oxynitrides. The second mask removal layer 116 may have a thickness ranging from about 10 nm to 500 nm. The second pattern 236 may be formed using a second removal step, where the second removal step may be any etching technique known in the art, such as, for example, Tetramethylammonium Hydroxide (TMAH) or hydrogen peroxide, which removes portions of the second mask 106 from the post-reaction layer 105. In this embodiment, the portions of the second mask 106 removed will expose the substrate 102 underneath the portions of the second mask 106.

Figure 10:
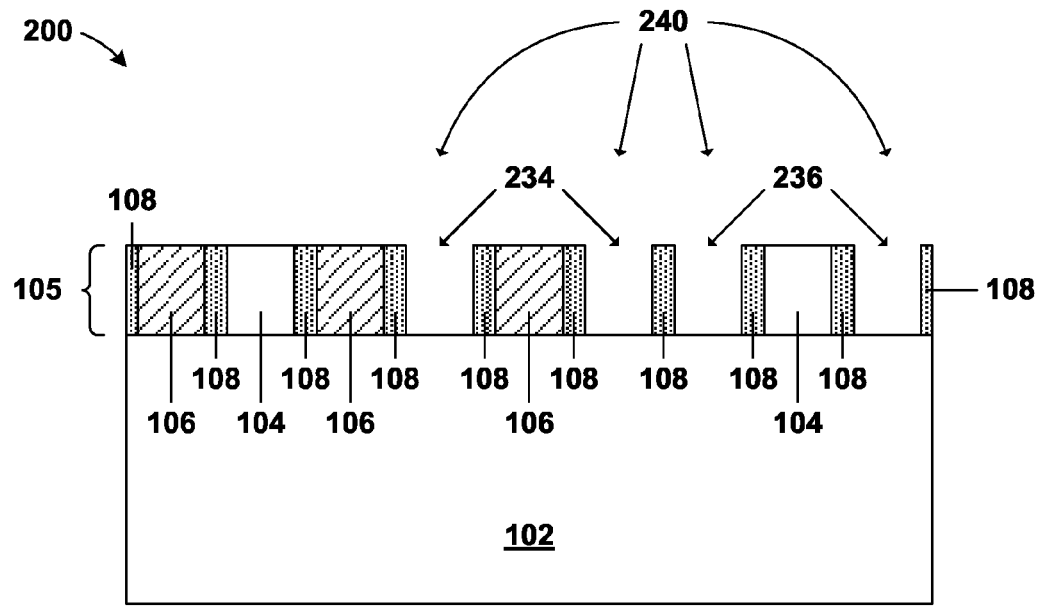
FIGS. 10 and 11 are cross section views of the alternative semiconductor structure and illustrate the formation of a final pattern in a substrate, according to another embodiment.
Figure 11:
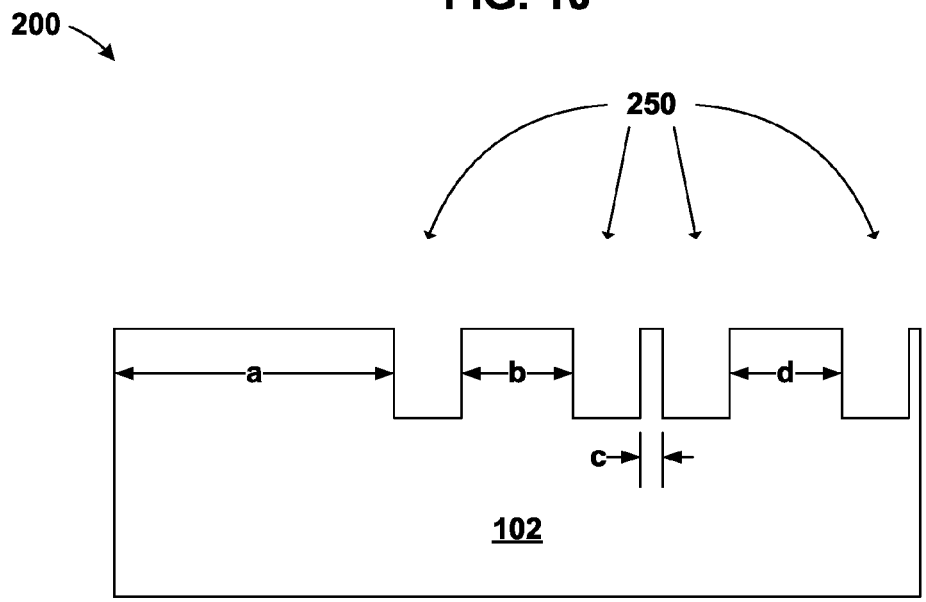

FIGS. 10 and 11 are demonstrative illustrations of the structure 200 during an intermediate step of a method of using the post-reaction layer 105 to form the final pattern 250 in the substrate 102. More specifically, the method can include transferring a transfer pattern 240 into the substrate 102.

The transfer pattern 240 may include the first pattern 234 and the second pattern 236. The transfer pattern 240 may be transferred to the substrate 102 using any etching technique known in the art, such as, for example, Reactive Ion Etching (RIE). The transfer pattern 240 may form the final pattern 250 in the substrate 102, where the final pattern may be similar to the transfer pattern 240. The final pattern 250 may be a combination of patterns formed in the post-reaction layer 105. The combination of patterns may include the first pattern 234, the second pattern 236, or any other patterns.

The final pattern 250 may have features defined by different patterns. A first feature (a) may be defined by lithography. A second feature (b) may be defined by the pitch of the features created by the material of the first mask 104, the width of the features created by the material of the first mask 104, and the diffusion properties of the first mask 104 and the second mask 106. A third feature (c) may be defined by the diffusion properties of the first mask 104 and the second mask 106, the third feature (c) is referred to as the width (w) above. A fourth feature (d) may be defined by the width of the features created by the material of the first mask 104, and the diffusion properties of the first mask 104 and the second mask 106.

The exemplary embodiment may include having; the substrate 102 being silicon nitride, the first mask 104 being poly-crystalline silicon, the second mask 106 being poly-crystalline germanium, and the third mask 108 being a silicon-germanium alloy. The post-reaction layer 105 should provide enough resistance for the amount of pattern transfer required for the final pattern 250, such as, for example, if the substrate is 30 nm, and selectivity of RIE is 1:1, the post-reaction layer should be larger than 30 nm, such as, for example, 60 nm. The first removal step is TMAH, the second removal step is hydrogen peroxide. The first removal step and the second removal step forms the transfer pattern 240. Finally, the transfer pattern 240 can be transferred into the substrate 102 using RIE.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure comprising:
   forming a first mask and a second mask having a vertical interface between the first mask and the second mask, the first mask is poly silicon and the second mask is poly germanium;
   forming a third mask at the vertical interface between the first mask and the second mask using a diffusion process, wherein the third mask extends into a portion of the first mask and into a portion of the second mask, and wherein the third mask is poly silicon germanium;
   forming a transfer pattern in a post-reaction layer, the post-reaction layer comprising the first mask, the second mask, and the third mask, and forming the transfer pattern further comprising:
   forming a first pattern by removing a portion of the first mask selective to the second mask and the third mask; and
   forming a second pattern by removing a portion of the second mask selective to the first mask and the third mask.

2. The method of claim 1, further comprising:
   polishing the second mask exposing the first mask.

3. The method of claim 1, wherein the diffusion process includes an annealing process.

4. The method of claim 1, wherein the diffusion process includes a plasma reaction.

* * * * *